(12) United States Patent
Cheng et al.

(10) Patent No.: US 10,497,701 B2
(45) Date of Patent: Dec. 3, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tung-Wen Cheng, New Taipei (TW); Chih-Shan Chen, New Taipei (TW); Mu-Tsang Lin, Hemei Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/082,295

(22) Filed: Mar. 28, 2016

(65) Prior Publication Data
US 2017/0179120 A1 Jun. 22, 2017

Related U.S. Application Data

(60) Provisional application No. 62/268,440, filed on Dec. 16, 2015.

(51) Int. Cl.
| | |
|---|---|
| *H01L 27/088* | (2006.01) |
| *H01L 21/8234* | (2006.01) |
| *H01L 23/528* | (2006.01) |
| *H01L 29/06* | (2006.01) |
| *H01L 29/66* | (2006.01) |

(Continued)

(52) U.S. Cl.
CPC .. *H01L 27/0886* (2013.01); *H01L 21/823431* (2013.01); *H01L 21/823475* (2013.01); *H01L 23/528* (2013.01); *H01L 29/0657* (2013.01); *H01L 29/41791* (2013.01); *H01L 29/66795* (2013.01); *H01L 29/785* (2013.01); *H01L 29/7848* (2013.01); *H01L 29/66545* (2013.01)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795; H01L 29/7848; H01L 29/0657
See application file for complete search history.

(56) References Cited

U.S. PATENT DOCUMENTS

| | | | |
|---|---|---|---|
| 8,753,942 B2 * | 6/2014 | Kuhn | B82Y 10/00 257/24 |
| 8,835,244 B2 | 9/2014 | Xie et al. | |
| 10,164,110 B2 | 12/2018 | Basker et al. | |

(Continued)

FOREIGN PATENT DOCUMENTS

| | | |
|---|---|---|
| CN | 104752229 A | 7/2015 |
| TW | 201434093 A | 9/2014 |

*Primary Examiner* — Tuan A Hoang
(74) *Attorney, Agent, or Firm* — Slater Matsil, LLP

(57) ABSTRACT

A semiconductor device includes a semiconductor substrate, a plurality of semiconductor fins, a gate stack and an epitaxy structure. The semiconductor fins are present on the semiconductor substrate. The semiconductor fins respectively include recesses therein. The gate stack is present on portions of the semiconductor fins that are adjacent to the recesses. The epitaxy structure is present across the recesses of the semiconductor fins. The epitaxy structure includes a plurality of corners and at least one groove present between the corners, and the groove has a curvature radius greater than that of at least one of the corners.

20 Claims, 7 Drawing Sheets

(51) Int. Cl.
   *H01L 29/417*   (2006.01)
   *H01L 29/78*    (2006.01)

(56) References Cited

U.S. PATENT DOCUMENTS

| | | |
|---|---|---|
| 2009/0007036 A1 | 1/2009 | Cheng et al. |
| 2011/0210404 A1 | 9/2011 | Su et al. |
| 2012/0138886 A1 | 6/2012 | Kuhn et al. |
| 2014/0001520 A1 | 1/2014 | Glass et al. |
| 2014/0203338 A1* | 7/2014 | Kelly ............... H01L 29/785 257/288 |
| 2015/0035023 A1* | 2/2015 | Kim ............... H01L 29/785 257/288 |
| 2015/0076607 A1 | 3/2015 | Alptekin et al. |
| 2015/0079367 A1* | 3/2015 | Kim ............... B32B 5/245 428/215 |
| 2015/0079751 A1* | 3/2015 | Alptekin ........... H01L 29/785 438/283 |
| 2015/0170916 A1* | 6/2015 | Yu ............... H01L 21/02664 438/493 |
| 2015/0187914 A1* | 7/2015 | Basker ........... H01L 29/66795 257/401 |
| 2015/0295089 A1 | 10/2015 | Huang et al. |
| 2016/0079367 A1* | 3/2016 | Yoo ............... H01L 29/785 257/77 |
| 2016/0104787 A1* | 4/2016 | Kittl ............... H01L 29/665 438/283 |
| 2016/0284700 A1* | 9/2016 | Yoon ............... H01L 27/0886 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/268,440, filed Dec. 16, 2015, which is herein incorporated by reference.

BACKGROUND

In the race to improve transistor performance as well as reduce the size of transistors, transistors have been developed that the channel and source/drain regions are located in a fin formed from the substrate. Such non-planar devices are multiple-gate FinFETs. A multiple-gate FinFET may have a gate electrode that straddles across a fin-like silicon body to form a channel region. Epitaxy source/drain regions may be formed adjacent to the channel region to increase carrier mobility in the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
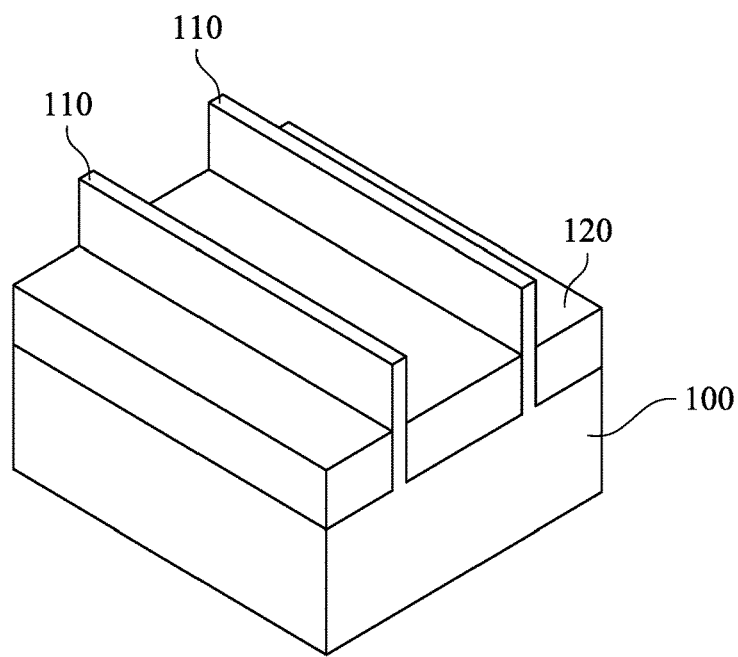
FIG. 1 to FIG. 13 illustrate different steps of a method of forming a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 13 illustrate different steps of a method of forming a semiconductor device according to some embodiments of the present disclosure. Reference is made to FIG. 1. A plurality of semiconductor fins 110 are formed on a substrate 100. In some embodiments, the substrate 110 includes a bulk silicon substrate. In some embodiments, the substrate 100 may be silicon in a crystalline structure. In some other embodiments, the substrate 100 may include other elementary semiconductors, such as germanium, or include a compound semiconductor, such as silicon carbide, gallium arsenide, indium arsenide, or indium phosphide. In yet some other embodiments, the substrate 100 includes a silicon-on-insulator (SOI) substrate. The SOI substrate may be fabricated using separation by implantation of oxygen, wafer bonding, and/or other suitable methods.

The semiconductor fins 110 extend from the substrate 100. The semiconductor fins 110 may be fabricated by using suitable processes, such as photolithography and etching. In some embodiments, the semiconductor fins 110 may be etched from the substrate 100 by using dry etching or a plasma process. Thereafter, an isolation structure 120 is formed to fill lower portions of trenches between the semiconductor fins 110 as shallow trench isolation (STI). In other words, the semiconductor fins 110 are surrounded by the isolation structure 120. The isolation structure 120 may include any suitable dielectric material, such as silicon oxide. The method of forming the isolation structure 120 may include depositing a dielectric material on the substrate 100 to cover the semiconductor fins 110, optionally performing a planarization process to remove the excess dielectric material outside the trenches between the semiconductor fins 110, and then performing an etching process on the remaining dielectric material until upper portions of the semiconductor fins 110 are exposed.

Figure 2:
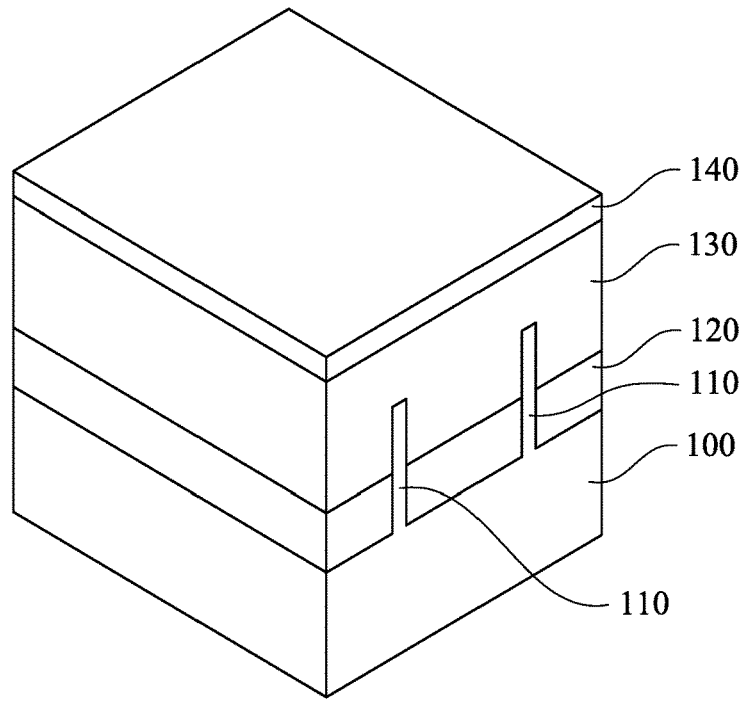

Reference is made to FIG. 2. A dummy gate material layer 130 is formed on the semiconductor fins 110. The dummy gate material layer 130 may include polysilicon. The dummy gate material layer 130 can be formed by a deposition process, such as a chemical vapor deposition (CVD) process. A mask layer 140 is formed on the dummy gate material layer 130 by a deposition process, such as a CVD process. In some embodiments, the mask layer 140 may include a hard mask such as silicon nitride (SiN), silicon oxide or combinations thereof. In some embodiments, the mask layer 140 may be a multilayer structure. For example, the mask layer 140 may include a silicon nitride layer formed on the dummy gate material layer 130 and a silicon oxide layer formed on the silicon nitride layer.

Figure 3:
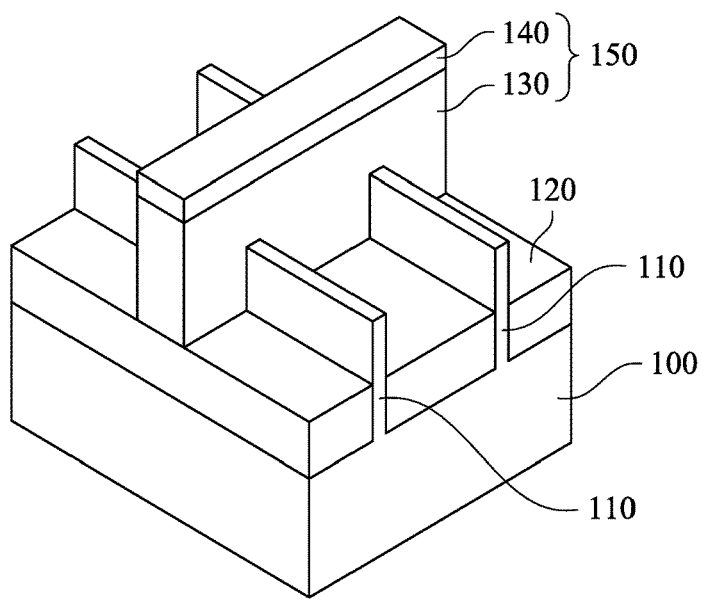

Reference is made to FIG. 3. The mask layer 140 and the dummy gate material layer 130 are patterned to form a dummy gate stack 150 crossing portions the semiconductor fins 110. Other portions of the semiconductor fins 110 beside the dummy gate stack 150 are exposed. The patterning step includes performing photolithography and etching processes.

Figure 4:
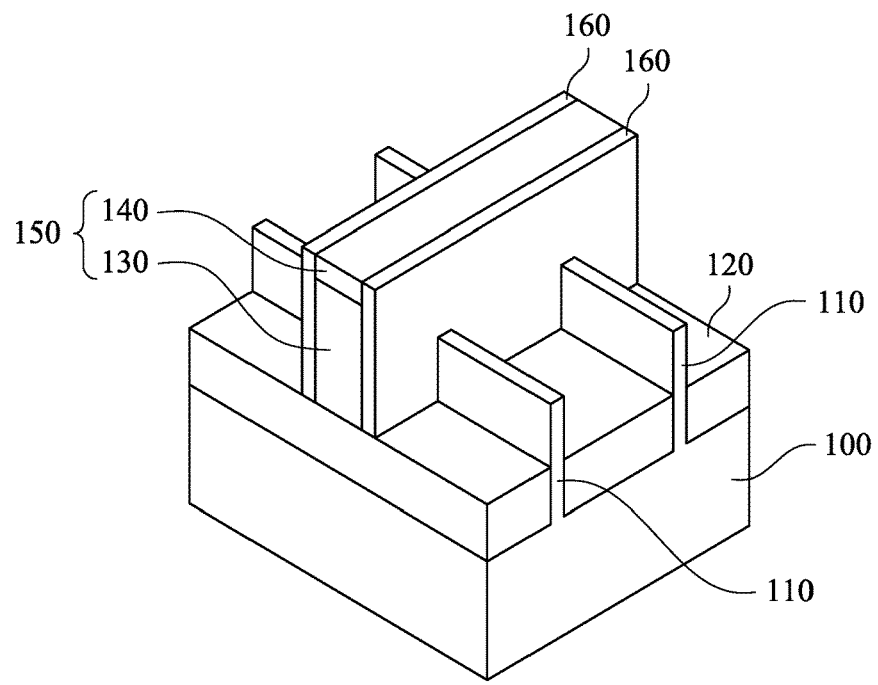

Reference is made to FIG. 4. A pair of spacers 160 are formed on opposite sidewalls of the dummy gate stack 150. In some embodiments, the spacers 160 may include silicon oxide, silicon nitride, silicon oxy-nitride, or other suitable materials. The spacers 160 may include a single layer or multilayer structure. The method of forming the spacers 160 includes forming a dielectric layer on the substrate 100 and then performing an etching process to remove a portion of the dielectric layer. In some embodiments, the spacers 160 may be used to offset subsequently formed doped regions, such as source/drain regions. The spacers 160 may further be used for designing or modifying the source/drain region profile.

Figure 5:
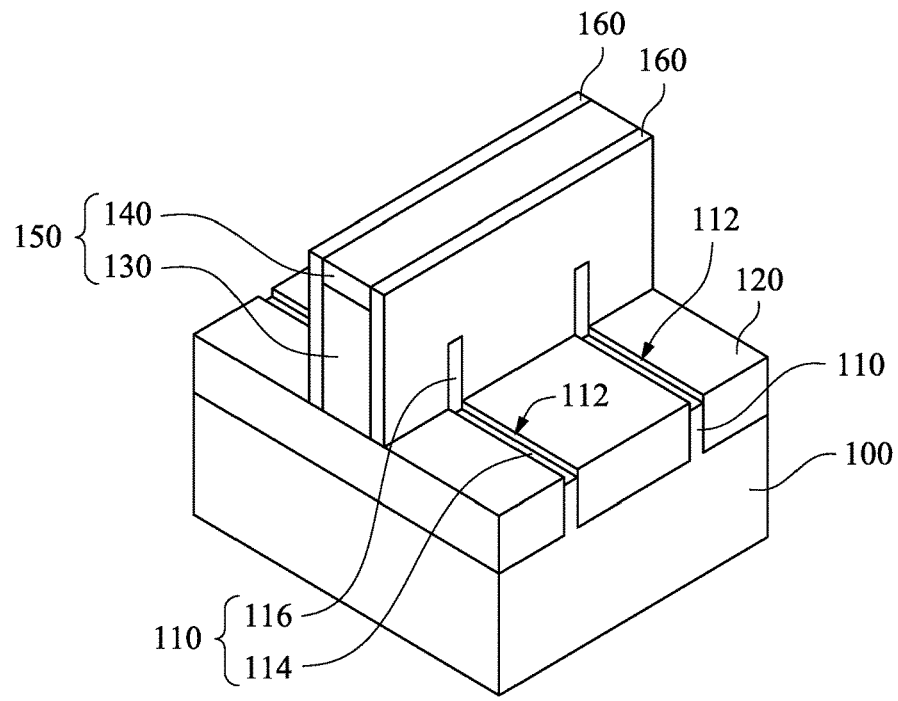

Reference is made to FIG. 5. Portions of the semiconductor fins 110 exposed by the dummy gate stack 150 and the spacers 160 are respectively partially removed (or partially recessed) to form recesses 112. At least one of the remaining semiconductor fins 110 has an embedded portion 114 and a protruding portion 116 after this removal. The embedded portion 114 is embedded in the isolation structure 120, and the embedded portion 114 is at least partially exposed by the recess 112. The protruding portion 116 protrudes from the embedded portion 114 and adjacent to the recess 112. The dummy gate stack 150 and the spacers 160 cover the protruding portion 116, and opposite sidewalls of the protruding portion 116 are respectively exposed by the spacers 160. This removal may be performed by a reactive ion etch (RIE) using the dummy gate stack 150 and spacers 160 as hardmasks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve desired profiles for the embedded portions 114 of the semiconductor fins 110.

Figure 6:
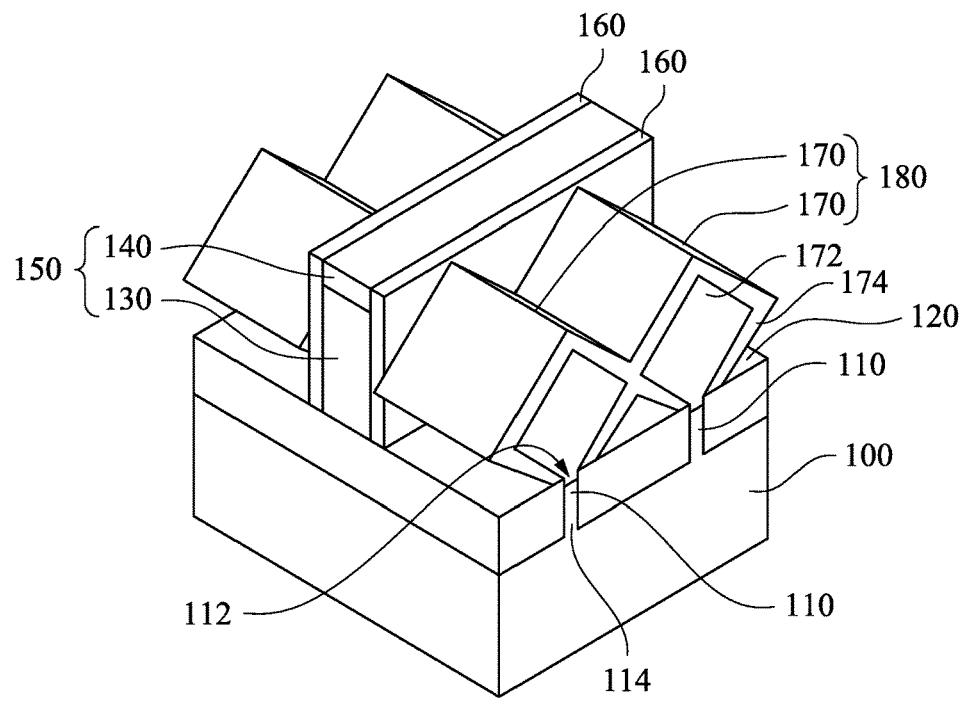

Reference is made to FIG. 6. Unshaped epitaxy structures 170 are respectively formed in the recesses 112 and on the embedded portions 114 of the semiconductor fins 110. During the epitaxy process, the epitaxy growth of the unshaped epitaxy structures 170 extend vertically and laterally, such that the unshaped epitaxy structures 170 are merged together (or physically connected) to form an unshaped merged epitaxy structure 180 that is present across the recesses 112 of the semiconductor fins 110. The unshaped epitaxy structures 170 may be formed by using one or more epitaxy or epitaxial (epi) processes, such that Si features, SiGe features, other suitable features or combinations thereof can be formed in a crystalline state on the embedded portions 114 of the semiconductor fins 110. For example, at least one of the unshaped epitaxy structures 170 has an epitaxy layer 172 and a cap layer 174. The cap layer 174 caps the epitaxy layer 172. In some embodiments, the epitaxy layer 172 includes silicon germanium, and the cap layer 174 includes silicon. The epitaxy layer 172 can be formed on the embedded portion 114 by epitaxy growth. The cap layer 174 can be formed on the epitaxy layer 172 by epitaxy growth as well. In some embodiments, the cap layer 174 includes substantially pure silicon. Such a cap layer 174 may increase the electrical conductivity of the unshaped epitaxy structure 170. The cap layers 174 of the unshaped epitaxy structures 170 are merged.

In some embodiments, a lattice constant of the unshaped epitaxy structures 170 is different from a lattice constant of the semiconductor fins 110, so that the channels in the protruding portions of the semiconductor fins 110 covered by the dummy gate stack 150 can be strained or stressed by the epitaxy structures 170 to improve carrier mobility of the semiconductor device and enhance the device performance. For example, the semiconductor fins 110 include silicon, and the epitaxy layers 172 of the epitaxy structures 170 include silicon germanium. Some examples of the epitaxy process include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the embedded portions 114 of the semiconductor fins 110. In some embodiments, when the unshaped epitaxy structures 170 include silicon germanium, such as having the silicon germanium epitaxy layer 172, the precursors of epitaxy growth of the unshaped epitaxy structures 170 may include silicon-containing gas and germanium-containing gas, such as $SiH_4$ and $GeH_4$, respectively, and the partial pressures of the silicon-containing gas and germanium-containing gas are adjusted to modify the germanium atomic percentage and the silicon atomic percentage. During the epitaxy growth, the flow rate of the germanium-containing precursor can be controlled to adjust sizes of the unshaped epitaxy structures 170. In some embodiments, the flow rate of the germanium-containing gas can be controlled to increase the sizes of the unshaped epitaxy structures 170, and such a flow rate control of the germanium-containing gas may increase the area on which a source/drain contact can be formed in a subsequent process.

In some embodiments, the unshaped epitaxy structures 170 may be in-situ doped. The doping species include, for example, a p-type dopant, such as boron or $BF_2$, and/or other suitable dopants. If the unshaped epitaxy structures 170 are not in-situ doped, a second implantation process (i.e., a junction implant process) is performed to dope the unshaped epitaxy structures 170. One or more annealing processes may be performed to activate the unshaped epitaxy structures 170. The annealing processes include rapid thermal annealing (RTA) and/or laser annealing processes.

Figure 7:
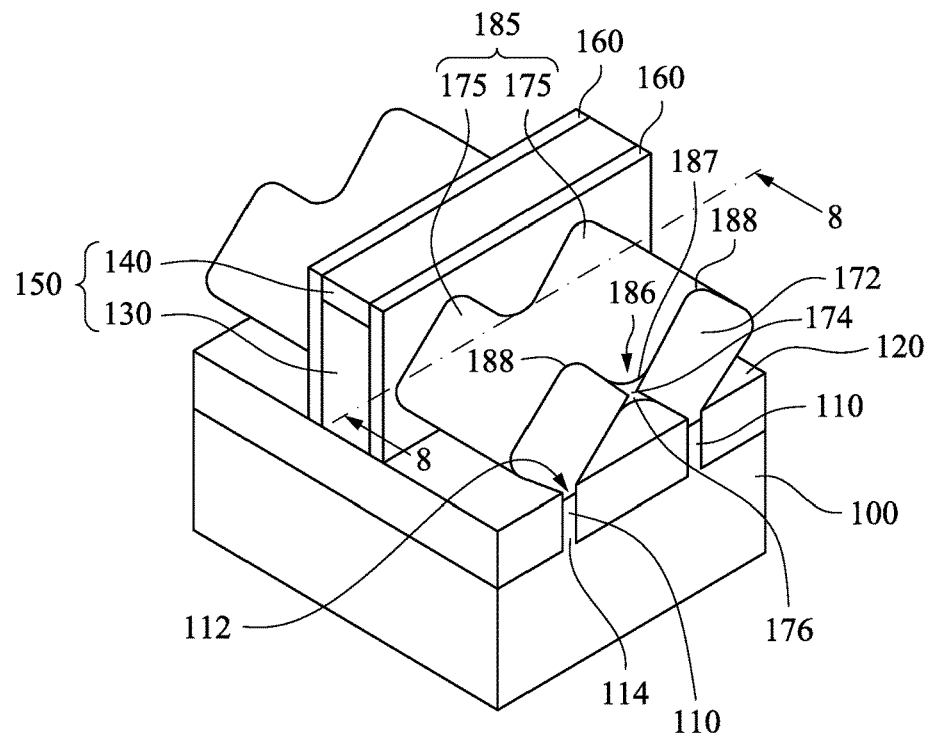
Figure 8:
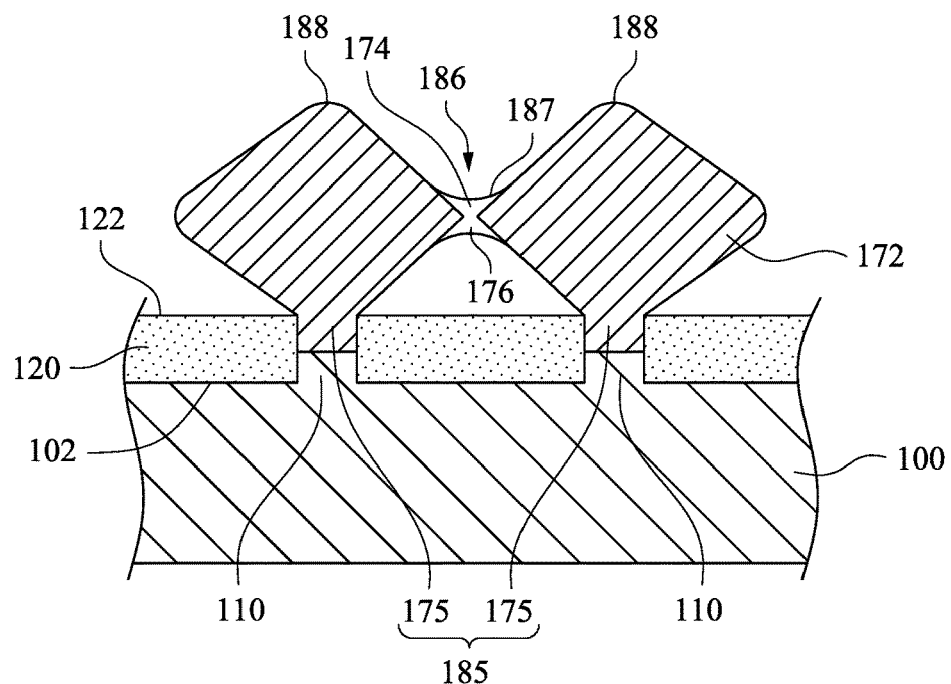

Reference is made to FIG. 7 and FIG. 8, in which FIG. 8 is a cross-sectional view taken along line 8 in FIG. 7. A shape modifying process is performed to shape the unshaped merged epitaxy structure 180 of FIG. 6 as a shaped merged epitaxy structure 185. For example, the merged epitaxy structure 180 of FIG. 6 can be etched to form the merged epitaxy structure 185 with substantially smooth corners. Since the merged epitaxy structure 185 is shaped by the shape modifying process, the merged epitaxy structure 185 includes at least one curved groove 186 that is substantially round. Such a substantially round groove 186 may increase the area on which the source/drain contact can be formed in a subsequent process. In other words, the unsaped epitaxy structures 170 in FIG. 6 are shaped as the shaped epitaxy structures 175 in FIG. 7, and a groove between the unshaped epitaxy structures 170 in FIG. 6 is shaped as the groove 186 between the shaped epitaxy structures 175 in FIG. 7, such that groove 186 between the shaped epitaxy structures 175 in FIG. 7 has a curvature radius greater than the groove between the unshaped epitaxy structures 170 in FIG. 6. Stated differently, the unshaped epitaxy structures 170 in FIG. 6 are shaped to form shaped epitaxy structures 175 in FIG. 7 that cooperatively form a concave surface 187, and the concave surface 187 defines the substantially round groove 186 thereon. In other words, the concave surface 187 is substantially round to serve as a bottom surface of the substantially round groove 186. Such a substantially round profile of the concave surface 187 may increase the area on which the source/drain contact can be formed in a subsequent process. In some embodiments, the curvature radius of the concave surface 187 (or the substantially round groove 186) is greater than about 0.5 nm, which may increase the area on which the source/drain contact can be formed. In some embodiments, the height of at least one of the shaped epitaxy structures 175 ranges from about 40 nm to about 60 nm. In some embodiments, the width of at least one of the shaped epitaxy structures 175 ranges from about 30 nm to about 50 nm.

In some embodiments, as shown in FIG. 8, the shaped merged epitaxy structure 185 has top corners 188. The top corners 188 of the shaped merged epitaxy structure 185 respectively overly the semiconductor fins 110 on which the shaped epitaxy structures 175 are formed. In other words, projections of the top corners 188 on the surface 102 of the substrate 100 respectively overlap with semiconductor fins 110. The substantially round groove 186 is present between the top corners 188, and the concave surface 187 is present between the top corners 188 as well. In some embodiments, the shape modifying process shapes the top corners 188 as substantially round corners. In some embodiments, at least one of the substantially round top corners 188 has a curvature radius less than the curvature radius of the substantially round groove 186 due to the shape modifying process. In other words, the curvature radius of the substantially round groove 186 is greater than that of the substantially round top corner 188, so that the area on which the source/drain contact is formed can be increased. For example, the curvature radius of the substantially round groove 186 is greater than about 0.5 nm, and the curvature radius of the substantially round top corner 188 ranges from about 1 nm to about 10 nm, or less than about 0.5 nm.

The substantially round top corners 188 are convex with respect to the substantially round groove 186. In other words, the substantially round groove 186 is concave with respect to the substantially round top corners 188 and present between the substantially round top corners 188. Stated differently, the substantially round top corners 188 are adjacent to opposite sides of the concave surface 187, and the concave surface 187 has a bottom closer to the substrate 100 than the substantially round top corners 188 being. In other words, a distance from the bottom of the concave surface 187 to the surface 102 of the substrate 100 is shorter than distances from the substantially round top corners 188 to the surface 102 of the substrate 100. In such a configuration, the substantially round top corners 188 and the substantially round groove 186 can form a substantially wavy surface together, and the concave region of the substantially wavy surface has a curvature radius greater than that of the convex region of the substantially wavy surface, which may increase the area that the source/drain contact can be formed thereon.

In some embodiments, after the shape modifying process, at least portions of the cap layers 174 are removed. The merged portions of the cap layers 174 present between the epitaxy layers 172 are remained to serve as a merged cap layer 176. The substantially round groove 186 is formed on an outer surface of the merged cap layer 176. In other words, the merged cap layer 176 is shaped to form the concave surface 187 thereon. In some embodiments, the cap layers 174 are shaped, and the epitaxy layers 172 are not shaped. In some embodiments, the cap layers 174 and the epitaxy layers 172 are shaped. In some embodiments, after the shape modifying process, portions of the epitaxy layers 172 are exposed, and the exposed surfaces of the epitaxy layers 172 are adjacent to the concave surface 187 that defines the substantially round groove 186.

In some embodiments, the substantially round top corners 188 are formed on the epitaxy layers 172. In other words, the epitaxy layers 172 have substantially round top corners shaped by the shape modifying process. In some embodiments, a bottom of the substantially round groove 186 and a top of the substantially round top corners 188 are made of different materials. For example, the bottom of the substantially round groove 186 includes silicon, and the top of the substantially round top corners 188 includes silicon germanium. In some embodiments, an optional epitaxy process can be performed to the merged epitaxy structure 185 for forming another silicon cap on the merged epitaxy structure 185, so as to improve the electrical conductivity.

In some embodiments, the shape modifying process includes an isotropic etching process. In other words, the isotropic etching process can be performed to the unshaped merged epitaxy structure 180 in FIG. 6 to form the shaped merged epitaxy structure 185 in FIG. 7. The isotropic etching is a form of etching that does not include a preferential direction. In some embodiments, the isotropic etching may be a germanium selectively etching process, a silicon selectively etching process or combinations thereof. For example, the etchant used in the isotropic etching process may include hydrofluoric acid (HF), hydrochloric acid (HCl), hydrogen bromide (Hbr) hydrogen peroxide ($H_2O_2$), other suitable etchants, or combinations thereof. The silicon selectively etching process refers to an etching process that is selective to silicon. In other words, an amount of a silicon-containing structure etched away is greater than an amount of another structure etched away in a single etching process. Similarly, the germanium selectively etching process refers to an etching process that is selective to germanium. In other words, an amount of a germanium-containing structure etched away is greater than an amount of another structure etched away in a single etching process.

In some embodiments, as shown in FIG. 8, the substrate 100 has a surface 102, and the semiconductor fins 110 are present on (or protrude from) the surface 102 of the substrate 100. A projection of the substantially round groove 186 on the surface 102 of the substrate 100 on which the semiconductor fins 110 are present is at least present between the semiconductor fins 110, and therefore, the area on which the source/drain contact can be formed is increased.

In some embodiments, as shown in FIG. 8, a portion of the isolation structure 120 underlies the merged epitaxy structure 185. In other words, a projection of the merged epitaxy structure 185 on the surface 102 of the substrate 100 overlaps with a projection of the isolation structure 120 on the surface 102 of the substrate 100. The isolation structure 120 has a top surface 122 proximal to the merged epitaxy structure 185. In other words, the top surface 122 is distal to the substrate 100. The top surface 122 of the isolation structure 120 is at least partially recessed due to the shape modifying process. In other words, the top surface 122 of the isolation structure 120 may be a concave surface, and such a concave profile is formed due to at least the shape modifying process. For example, the top concave surface 122 may be curved or substantially round.

Figure 9:
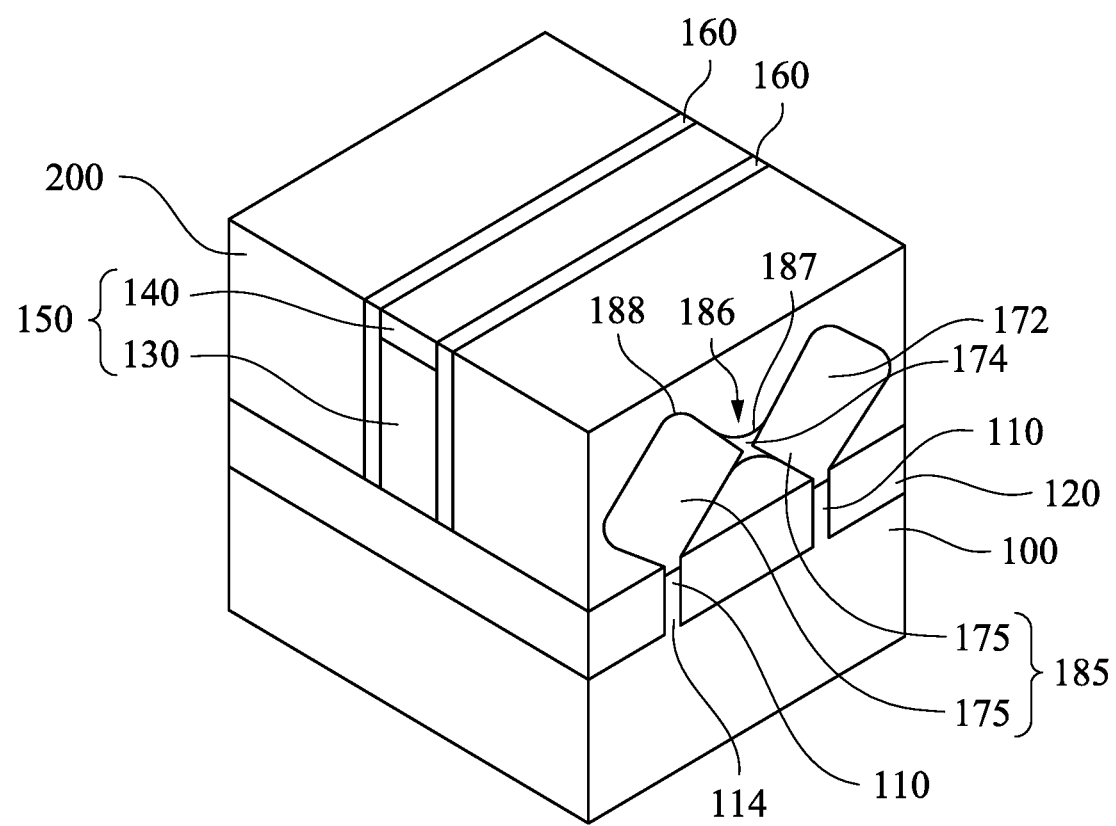

Reference is made to FIG. 9. An interlayer dielectric (ILD) layer 200 is formed on the substrate 100 to cover the dummy gate stack 150, the epitaxy structure 190 and the semiconductor fins 110. The ILD layer 200 may include silicon oxide, silicon nitride, silicon oxynitride, silicon carbide, a low-dielectric constant dielectric material, or combinations thereof. The ILD layer 200 can be formed by a deposition process, such as a CVD process. Afterwards, a portion of the ILD layer 200 is removed to expose a top surface of the dummy gate stack 150. The removing step may include performing a chemical-mechanical polishing (CMP) process.

Figure 10:
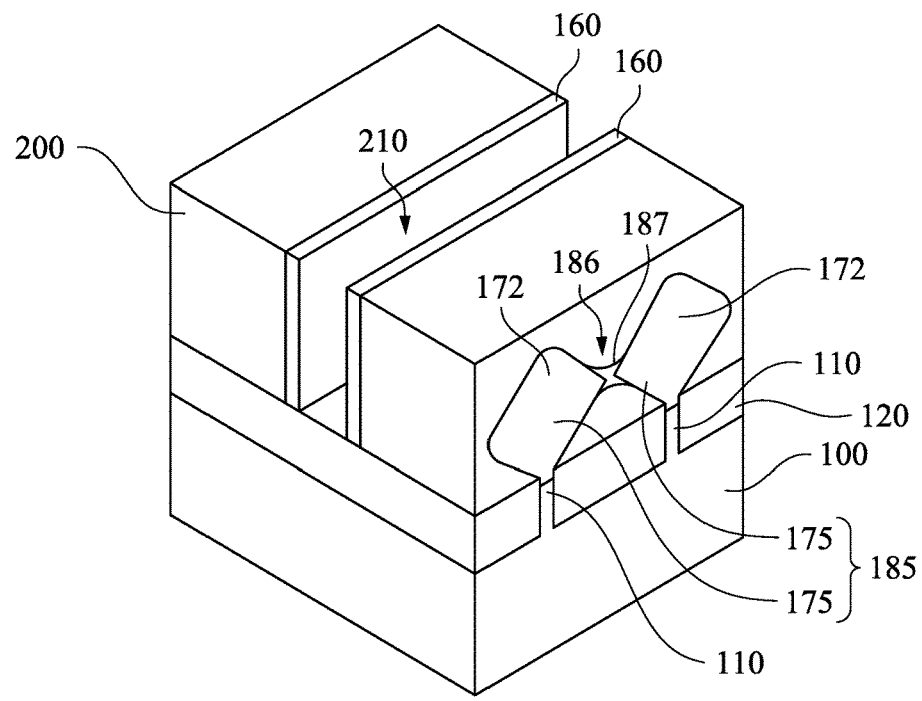

Reference is made to FIG. 10. The dummy gate stack 150 between the spacers 160 is removed to form a recess 210 by using suitable processes, such as photolithography and etching. Formation of the recess 210 may be performed by reactive ion etching (RIE) or by any other suitable removal process. Formation of the recess 210 may includes a selectively etching process that selectively etches the dummy gate stack 150 with respect to the underlying protruding portions of the semiconductor fins 110. During the formation of the recess 210, the spacers 160 and the ILD layer 200 may be protected by a mask, such as a photoresist mask or a hard mask. After the formation of the recess 210, the mask can be removed by ashing, stripping, or other suitable techniques.

Figure 11:
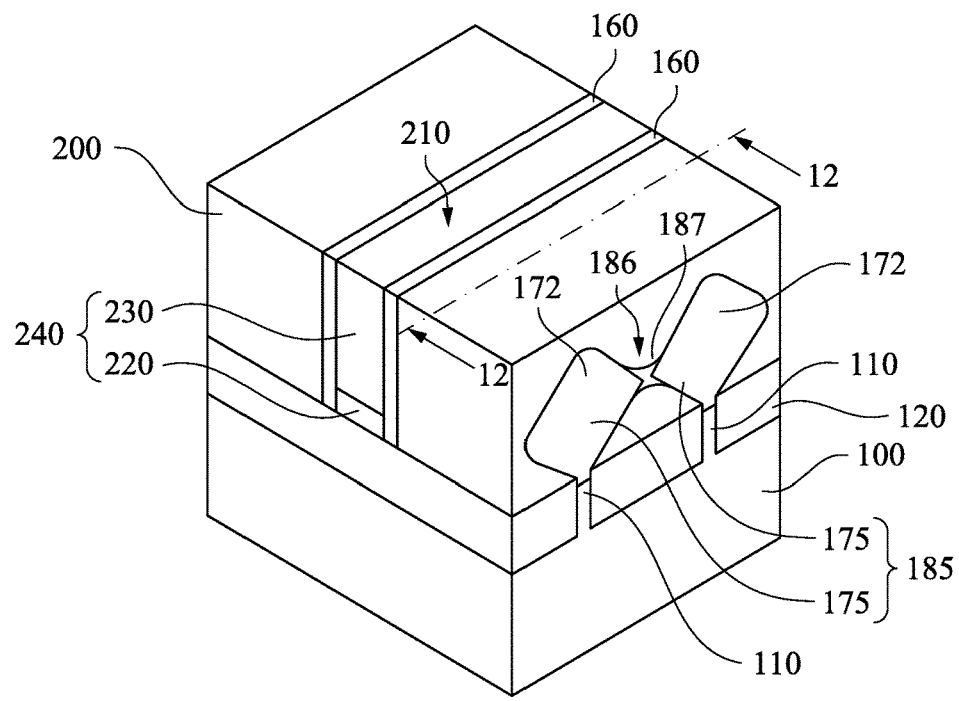
Figure 12:
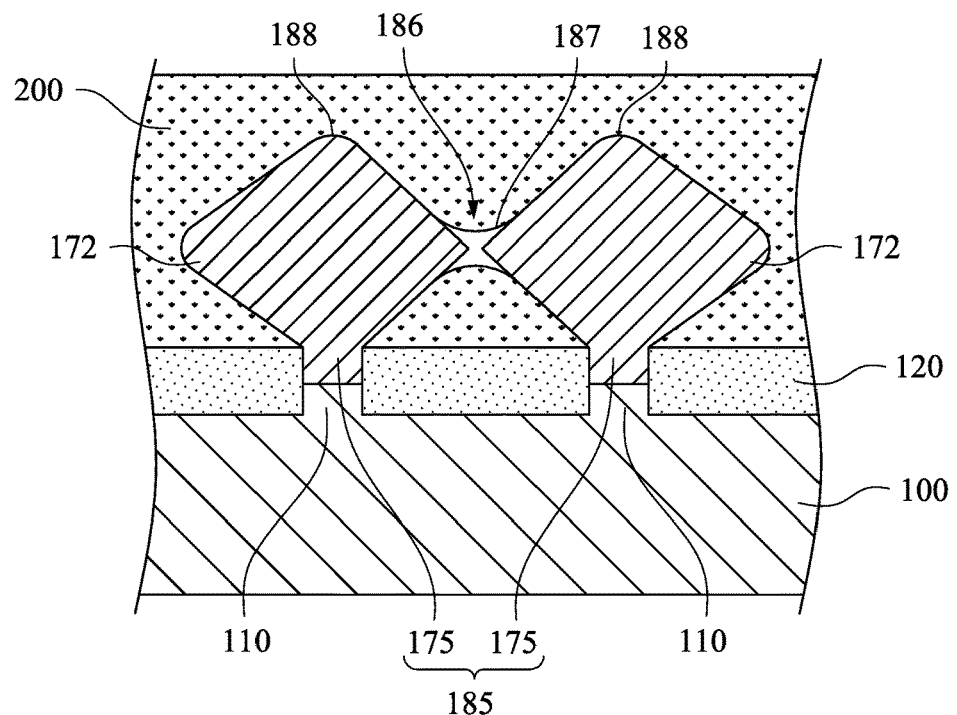

Reference is made to FIG. 11 and FIG. 12, in which FIG. 12 is a cross-sectional view taken along line 12 in FIG. 11. A gate dielectric layer 220 is formed in the recess 210 and on the protruding portions of the semiconductor fins 110 in the recess 210. The gate electrode layer 230 is formed in the recess 210 and on the gate dielectric layer 220. The gate dielectric layer 220 and the gate electrode layer 230 form a gate stack 240 between the spacers 160. The gate dielectric layer 220, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 220 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), or combinations thereof. The gate dielectric layer 220 may have a multilayer structure, such as one layer of silicon oxide (e.g., interfacial layer) and another layer of high-k material. The gate dielectric layer 220 may be formed by using CVD, physical vapor deposition (PVD), atomic layer deposition (ALD), thermal oxide, ozone oxidation, other suitable processes, or combinations thereof.

In some embodiments, the gate electrode layer 230 includes a semiconductor material such as polysilicon, amorphous silicon, or the like. The gate electrode layer 230 may be deposited doped or undoped. For example, in some embodiments, the gate electrode layer 230 includes polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode layer 230 may include a polysilicon metal alloy or a metal gate including metals such as tungsten (W), nickel (Ni), aluminum (Al), tantalum (Ta), titanium (Ti), or combinations thereof.

Figure 13:
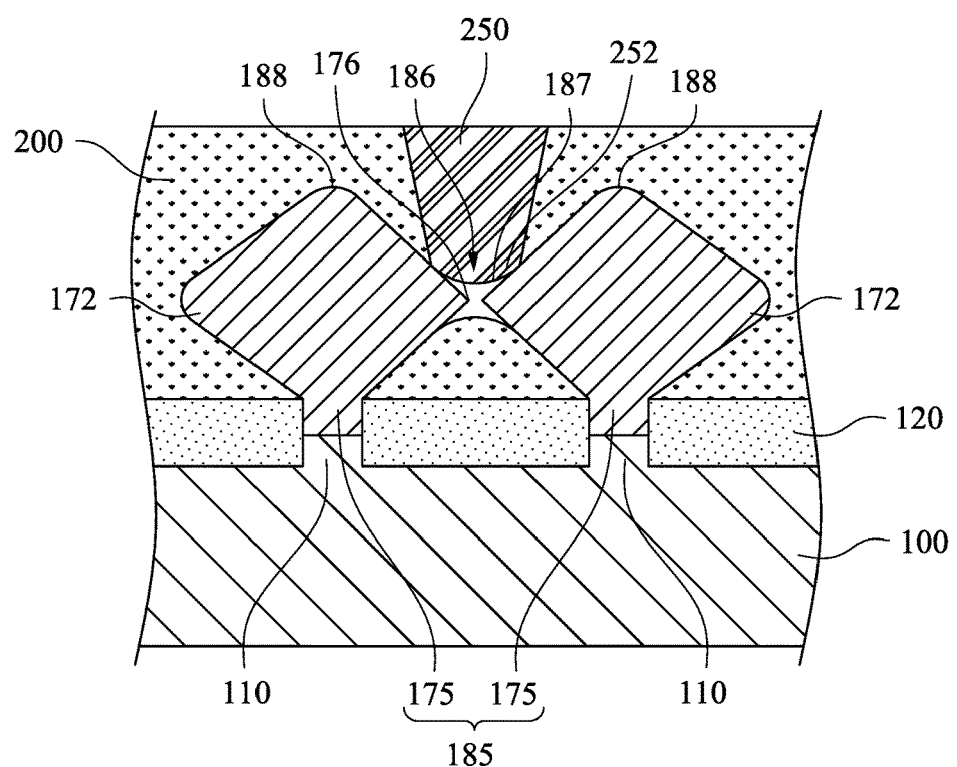

Reference is made to FIG. 13. A source/drain contact 250 is formed through the ILD layer 200 and contacts with the substantially round concave surface 187 of the epitaxy structure 185. In other words, the source/drain contact 250 is formed on the substantially round groove 186. In some embodiments, since the source/drain contact 250 is formed on the substantially round concave surface 187, the source/drain contact 250 may include a substantially round bottom surface 252 with a shape corresponding to the substantially round concave surface 187. In other words, the substantially round bottom surface 252 is in contact with the substantially round concave surface 187, and the substantially round bottom surface 252 has a curvature radius substantially the same as that of the groove 186. In some embodiments, the curvature radius of the substantially round bottom surface 252 is greater than about 0.5 nm. In some embodiments, the curvature radius of the substantially round surface 252 is greater than the curvature radius of the substantially round top corner 188. Formation of the source/drain contact 250 may include forming a contact hole by an etching process to etch through the ILD layer 200 down to the substantially round concave surface 187 of the merged epitaxy structure 185 and depositing metal or other suitable conductive materials in the contact hole by a deposition process, such as a CVD process, to form the source/drain contact 250.

In some embodiments, the epitaxy structure present across the recesses of the semiconductor fins has a groove. Such a groove is shaped to have a curvature radius greater than that of a corner of the epitaxy structure. As a result, the source/drain contact can be formed on a greater area, and the contact resistance can be therefore reduced.

According to some embodiments, a semiconductor device includes a semiconductor substrate, a plurality of semiconductor fins, a gate stack and an epitaxy structure. The semiconductor fins are present on the semiconductor substrate. The semiconductor fins respectively comprise recesses therein. The gate stack is present on portions of the semiconductor fins that are adjacent to the recesses. The epitaxy structure is present across the recesses of the semiconductor fins. The epitaxy structure includes a plurality of corners and at least one groove present between the corners, and the groove has a curvature radius greater than that of at least one of the corners.

According to some embodiments, a semiconductor device includes a semiconductor substrate, a plurality of semiconductor fins, a gate stack and an epitaxy structure. The semiconductor fins are present on the semiconductor substrate. The semiconductor fins respectively comprise recesses therein. The gate stack is present on portions of the semiconductor fins that are adjacent to the recesses. The epitaxy structure present across the recesses of the semiconductor fins. The epitaxy structure includes at least one groove. The groove has a curvature radius greater than about 0.5 nm.

According to some embodiments, a method of forming a semiconductor device includes forming a plurality of semiconductor fins on a semiconductor substrate, removing portions of the semiconductor fins to form recesses, forming a gate stack on another portions of the semiconductor fins that are adjacent to the recesses, forming epitaxy structures in the recesses at least until the epitaxy structures are merged and form a groove on the merged epitaxy structures, and shaping the groove such that the groove after the shaping has a curvature radius greater than a curvature radius of the groove before the shaping.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;

a plurality of semiconductor fins present on the semiconductor substrate, the plurality of semiconductor fins respectively comprising recesses therein;
at least one gate stack present on portions of the plurality of semiconductor fins that are adjacent to the recesses;
at least one epitaxy structure present across the recesses of the plurality of semiconductor fins, the at least one epitaxy structure comprising a plurality of epitaxy layers and a plurality of cap layers, one of the plurality of cap layers extending between adjacent ones of the plurality of epitaxy layers, the plurality of cap layers being epitaxial layers, wherein the plurality of epitaxy layers comprises a plurality of top corners and a plurality of side corners, the at least one epitaxy structure having a first groove present between adjacent top corners of the plurality of top corners, the first groove having a curvature radius greater than that of at least one of the plurality of top corners, the first groove being made from top surfaces of two adjacent epitaxy layers of the plurality of epitaxy layers and a first cap layer of the plurality of cap layers between the two adjacent epitaxy layers, the plurality of epitaxy layers having different material compositions than the plurality of cap layers, wherein bottom surfaces of the plurality of epitaxy layers are not covered by the first cap layer, the at least one epitaxy structure having a bottom surface forming a second groove, the second groove extending from a first of the plurality of semiconductor fins to a second of the plurality of semiconductor fins, a topmost portion of the second groove having a different material composition than a bottommost portion of the second groove; and
at least one conductive contact present on the first groove, the conductive contact physically contacting at least one of the plurality of epitaxy layers and at least one of the plurality of cap layers.

2. The semiconductor device of claim 1, wherein a projection of the first groove on a surface of the semiconductor substrate on which the semiconductor fins are present is at least partially present between the semiconductor fins.

3. The semiconductor device of claim 1, wherein a bottom surface of the conductive contact has a curvature radius greater than that of at least one of the plurality of top corners or the plurality of side corners.

4. The semiconductor device of claim 1, wherein a bottom surface of the conductive contact has a curvature radius greater than about 0.5 nm.

5. The semiconductor device of claim 1, wherein the curvature radius of the first groove is greater than about 0.5 nm.

6. The semiconductor device of claim 1, wherein the curvature radius of at least one of the plurality of top corners or the plurality of side corners is less than about 0.5 nm.

7. The semiconductor device of claim 1, wherein the first cap layer is a bottommost portion of the first groove, and wherein the plurality of epitaxy layers is a topmost portion of the epitaxy structure.

8. A semiconductor device, comprising:
a semiconductor substrate;
a first semiconductor fin and a second semiconductor fin present on the semiconductor substrate, the first and second semiconductor fins respectively comprising recesses therein;
an isolation region present on the semiconductor substrate and surrounding lower portions of the first semiconductor fin and the second semiconductor fin;
at least one gate stack present on portions of the first and second semiconductor fins that are adjacent to the recesses, the at least one gate stack present on the isolation region; and
a first epitaxy structure present across the recesses of the first and second semiconductor fins, wherein a topmost surface of the first epitaxy structure comprises a first groove therein, the topmost surface having a first rounded corner over the first semiconductor fin and a second rounded corner over the second semiconductor fin, the first groove extending from the first rounded corner to the second rounded corner, the first groove comprising a first epitaxial layer, a second epitaxial layer, and a third epitaxial layer, the first epitaxial layer extending from the first semiconductor fin, the second epitaxial layer extending from the second semiconductor fin, and the third epitaxial layer extending from the first epitaxial layer to the second epitaxial layer, the first and second epitaxial layers having a same material composition, wherein a bottom surface of the first epitaxy structure comprises a second groove therein, the second groove extending from the first semiconductor fin to the second semiconductor fin, the second groove comprising the first epitaxial layer, the second epitaxial layer, and the third epitaxial layer, a topmost portion of the second groove having a different material composition than a bottommost portion of the second groove, the third epitaxial layer having a different material composition than the first and second epitaxial layers, wherein the third epitaxial layer does not contact the isolation region between the first semiconductor fin and the second semiconductor fin, and the first groove of the first epitaxy structure has a curvature radius greater than about 0.5 nm.

9. The semiconductor device of claim 8, wherein the first groove has a bottom closer to the semiconductor substrate than the first and second rounded corners.

10. The semiconductor device of claim 9, wherein the first rounded corner has a curvature radius less than that of the first groove.

11. The semiconductor device of claim 9, wherein the bottom of the first groove and the first rounded corner are made of different materials.

12. The semiconductor device of claim 8, further comprising:
a first contact having a bottom surface in contact with the first epitaxy structure, wherein the bottom surface of the first contact has a curvature radius substantially the same as that of the first groove.

13. The semiconductor device of claim 8, further comprising:
a first contact having a bottom surface in contact with the first epitaxy structure, wherein the bottom surface of the contact has a curvature radius greater than about 0.5 nm.

14. A semiconductor device, comprising:
a semiconductor substrate;
a first semiconductor fin extending from the semiconductor substrate;
a second semiconductor fin extending from the semiconductor substrate, the second semiconductor fin having a first side proximate the first semiconductor fin and a second side distal the first semiconductor fin; and
an epitaxial semiconductor structure extending from the first semiconductor fin to the second semiconductor fin and having a topmost surface, the topmost surface having a first peak above the first semiconductor fin and a second peak above the second semiconductor fin, the topmost surface forming a first groove between the first semiconductor fin and the second semiconductor fin, the first groove having a shape, when viewed in cross-section, of a continuous smooth curve from the first peak to the second peak, the epitaxial semiconductor structure having a bottommost surface forming a second groove, the second groove having a shape, when viewed in cross-section, of a continuous smooth curve extending from the first semiconductor fin to the second semiconductor fin, a portion of the first groove having a different material composition than the first peak and the second peak, a topmost portion of the second groove having a different material composition than a bottommost portion of the second groove.

15. The semiconductor device of claim 14, wherein the first groove has a curvature radius of greater than about 0.5 nm.

16. The semiconductor device of claim 14, wherein the first groove has a first curvature radius, and wherein the second groove has a second curvature radius, the second curvature radius about equal to the first curvature radius.

17. The semiconductor device of claim 14, wherein the topmost surface and the bottommost surface meet at a corner, the corner having a curvature radius of less than about 0.5 nm.

18. The semiconductor device of claim 17, further comprising:
at least one contact present on the first groove.

19. The semiconductor device of claim 18, wherein the at least one contact has a bottom surface in contact with the epitaxial semiconductor structure, wherein the bottom surface of the at least one contact has a curvature radius greater than that of the corner.

20. The semiconductor device of claim 18 further comprising:
an isolation region over the semiconductor substrate and surround lower portions of the first semiconductor fin and the second semiconductor fin, wherein the bottommost portion of the second groove is made from a first epitaxial layer, and the topmost portion of the second groove is made from a second epitaxial layer, wherein the first epitaxial layer physically contacts the isolation region, and wherein the second epitaxial layer does not physically contact the isolation region.

* * * * *